(12) United States Patent
Chen et al.

(10) Patent No.: US 11,181,266 B2
(45) Date of Patent: Nov. 23, 2021

(54) METHOD AND DEVICE FOR CALCULATING COMBUSTION IN WASTE INCINERATOR BED

(71) Applicant: Tianjin University, Tianjin (CN)

(72) Inventors: Guanyi Chen, Tianjin (CN); Tianbao Gu, Tianjin (CN); Wenchao Ma, Tianjin (CN); Chen Ma, Tianjin (CN); Li'an Hou, Tianjin (CN); Beibei Yan, Tianjin (CN); Bin Liu, Tianjin (CN)

(73) Assignee: TIANJIN UNIVERSITY, Tianjin (CN)

( * ) Notice: Subject to any disclaimer, the term of this patent is extended or adjusted under 35 U.S.C. 154(b) by 0 days.

(21) Appl. No.: 17/254,217

(22) PCT Filed: Jun. 21, 2018

(86) PCT No.: PCT/CN2018/092092
§ 371 (c)(1),
(2) Date: Dec. 18, 2020

(87) PCT Pub. No.: WO2019/241944
PCT Pub. Date: Dec. 26, 2019

(65) Prior Publication Data
US 2021/0262658 A1    Aug. 26, 2021

(51) Int. Cl.
*F23G 5/50* (2006.01)

(52) U.S. Cl.
CPC .......... *F23G 5/50* (2013.01); *F23G 2207/103* (2013.01); *F23G 2207/112* (2013.01);
(Continued)

(58) Field of Classification Search
CPC .. F23G 5/50; F23G 2207/103; F23G 2207/40; F23G 2207/20; F23G 2207/112; F23G 2207/114
See application file for complete search history.

(56) References Cited

U.S. PATENT DOCUMENTS 5,548,907 A * 8/1996 Gourdine ................ F23D 11/32
34/448
2016/0370001 A1   12/2016 Sim

FOREIGN PATENT DOCUMENTS

| CN | 106292600 | 1/2017 |
| CN | 107702745 | 2/2018 |

(Continued)

OTHER PUBLICATIONS

International Search Report for PCT/CN2018/092092, dated Mar. 1, 2019, 4 pages.

(Continued)

*Primary Examiner* — David J Laux
(74) *Attorney, Agent, or Firm* — Dority & Manning, P.A.

(57) ABSTRACT

Disclosed is a method for calculating combustion in the bed of a waste incinerator. The method is based on a model of combustion in a waste incinerator bed and comprises a water evaporation model, a volatile matter analysis model, a volatile matter combustion model, and a fixed carbon combustion model. The volatile matter of the volatile matter combustion model comprises CO, $H_2$, $CH_4$, $NH_3$, and $H_2S$. The volatile matter combustion model comprises a combustion reaction equation for said volatile matter and $O_2$, and respective equations for CO and $CH_4$ reacting with water vapor. Equations governing the model of combustion in the bed of a waste incinerator comprise a continuity equation, an energy equation, a momentum equation, and a component equation. Boundary conditions of said governing equations comprise: equations of heat transfer and mass transfer from an upper boundary layer of the bed to the exterior; and equations of heat transfer and mass transfer from lower boundary layer of the bed to the exterior.

10 Claims, 7 Drawing Sheets

(52) U.S. Cl.
CPC .... *F23G 2207/114* (2013.01); *F23G 2207/20* (2013.01); *F23G 2207/40* (2013.01)

(56) References Cited

FOREIGN PATENT DOCUMENTS

| | | |
|---|---|---|
| CN | 107765948 | 3/2018 |
| CN | 107944074 | 4/2018 |

OTHER PUBLICATIONS

Li et al, "Experimental Study of Moisture Impact on Municipal Solid Waste Incineration", abstract only, 1 page.

* cited by examiner

METHOD AND DEVICE FOR CALCULATING COMBUSTION IN WASTE INCINERATOR BED

CROSS-REFERENCE TO RELATED APPLICATIONS

This application claims the benefit of PCT international patent application No. PCT/CN2018/092092, entitled "Method and device for calculating combustion in waste incinerator bed", filed on Jun. 21, 2018, which is incorporated by reference herein in its entirety.

TECHNICAL FIELD

The present application relates to a method and device for calculating combustion in a waste incinerator, an apparatus, and a storage medium.

BACKGROUND

With a rapid economic development and an advancement of urbanization, an accumulation amount of municipal solid waste is increasing rapidly, in order to realize an efficient treatment and a safe energy utilization of municipal solid waste, it is necessary to vigorously develop a variety of waste treatment technologies, such as sanitary landfill, composting, and incineration. Currently, due to the advantages of municipal solid waste incineration technology in terms of rapid waste reduction and energy utilization, it is more and more favored and its application range is wider and wider. As of 2015, the amount of municipal solid waste processed by the municipal solid waste incineration technology accounted for more than 32% of the total amount processed by various waste treatment technologies. Therefore, it has great significance to intensively study the incineration process of municipal solid waste. In general, the incineration process of municipal solid waste in an incinerator may be divided into two parts: a gas phase combustion in a hearth and a gas-solid two-phase combustion in a bed. There have been many related studies on the gas phase combustion in a hearth with the help of Fluent commercial software, while there are few related studies on the gas-solid two-phase combustion in a bed. The existing methods for calculation of the gas-solid two-phase combustion in a bed is briefly described below.

The existing methods for calculation of the gas-solid two-phase combustion in a bed of a waste incinerator are mainly divided into two types: a calculation using a bed empirical model and a calculation using a Flic model. The calculation using the bed empirical model is to estimate, in an estimation manner, distributions of a temperature field, a flow field, and a concentration field of various substance and the like generated by wastes at different times and different positions during an incineration process in a bed, according to estimated combustion efficiency and certain experimental data; the calculation using the Flic model is to assume that a bed is a homogeneous porous medium, and to establish governing equations for solid phase and gas phase according to the three conservation laws, and then to obtain distributions of a temperature field, a flow field, and a concentration field of various substance and the like generated by wastes at different times and different positions during an incineration process in a bed by calculating and solving the governing equations.

At present, although field distribution results of wastes during a combustion process in a bed may be obtained based on the bed empirical model and the Flic model, there are still many drawbacks. In one aspect, for the bed empirical model, the establishment of which is not strictly based on the three conservation laws and the heat and mass transfer equations, the results obtained may not be guaranteed to be conserved in mass and energy, so results practically obtained are semi-empirical values with large errors; in another aspect, for the Flic model, the establishment of which is based on the three conservation laws, it has been improved as compared with the bed empirical model, but there are still problems of low calculation accuracy and narrow applications. The main reasons for the above problems are as follows:

(1) In the Flic model, fewer waste component elements are taken into account (that is, only three elements of C, H, O are considered), so it is impossible to simulate and calculate the generation distribution of other component contaminants;

(2) In the Flic model, there are fewer volatile matter combustion reaction models selected, only the reaction between combustible components and oxygen is taken into account, while the characteristic of higher water content of municipal solid waste itself is neglected, and a chemical reaction involving water vapor is not taken into account, resulting in inaccurate calculation results;

(3) The setting of boundary conditions of the Flic model is relatively simple, it is assumed that the top heat and mass transfer are uniform, resulting in a large deviation in calculation and inconsistence with actual combustion situations in the case of severe external heat and mass transfer (such as high temperature or large-scale furnace shape), which makes it difficult to accurately calculate an incineration status of a waste bed in an incinerator.

In addition, CN 107944074 A discloses a method for calculating combustion in a bed portion of a waste incinerator, however, the model provided has many deficiencies. Although in this model, N element among the waste component elements is taken into account, the reaction between combustible components and water vapor is still neglected, which leads to a large deviation between calculation results and actual situations, and therefore a poor calculation accuracy when simulating and calculating an incineration process of the waste with high moisture content. This model lacks explicit boundary condition settings, leading to incomplete calculations or inaccurate calculation results.

SUMMARY

In view of this, the present application provides a method and a device for calculating combustion in a waste incinerator bed, an apparatus, and a storage medium, which may improve many shortcomings of the existing models.

According to an aspect of the present invention, a method for calculating combustion in a waste incinerator bed is provided, the method is based on a model of combustion in a bed of a waste incinerator, and includes:

receiving initial condition data;

inputting the initial condition data into a governing equation of the model of combustion in the bed of the waste incinerator; and performing a calculation using the governing equations, to obtain a calculation result; displaying the calculation results; wherein the model of combustion in the bed of the waste incinerator includes a moisture evaporation model, a volatile matter analysis model, a volatile matter combustion model, and a fixed carbon combustion model; where volatile matter of the volatile matter combustion model includes $CO$, $H_2$, $CH_4$, $NH_3$, and $H_2S$, the volatile matter combustion model includes a combustion reaction equation for said volatile matter and $O_2$, and respective equations for CO and $CH_4$ reacting with water vapor; equations governing the model of combustion in the bed of a waste incinerator include a continuity equation, an energy equation, a momentum equation, and a component equation; boundary conditions of said governing equations include: equations of heat transfer and mass transfer from an upper boundary layer of the bed to the exterior, and equations of heat transfer and mass transfer from a lower boundary layer of the bed to the exterior.

According to a method of the present invention, preferably, the initial condition data includes: element analysis data, industrial analysis data, low heating value (LHV), and raw material size data of a target waste; the calculation result includes: a temperature distribution, a flow field distribution and a concentration distribution of gas component of a target waste in a bed during an incineration process, where the concentration distribution of gas component includes the concentration distributions of nitrides and/or sulfides.

According to a method of the present invention, preferably, the continuity equation includes a continuity equation of gas phase part and a continuity equation of solid phase part, where the continuity equation of the gas phase part is:

$$\frac{\partial(\phi \rho_g)}{\partial t} + div(\phi \rho_g u) = S_g$$

the continuity equation of the solid phase part is:

$$\frac{\partial \rho_s}{\partial t} = -S_g$$

where $\phi$ is a void fraction with a unit of %; $\rho_g$ is a density of a gas with a unit of $kg/m^3$; t is time with a unit of s; u is a flow rate of a gas with a unit of m/s; $\rho_s$ is a density of a solid with a unit of $kg/m^3$; $S_g$ is a source phase of the gas phase continuity equation.

According to a method of the present invention, preferably, the energy equation is:

$$\frac{\partial(\phi \rho_g C_{pg} T + (1-\phi)\rho_s C_{ps} T)}{\partial t} + div(\phi \rho_g u C_{pg} T) = div(k_{eff} \nabla T) + S_T$$

where T is a reaction temperature with a unit of K; $C_{pg}$ is a specific heat capacity of a gas with a unit of J/kg; $C_{ps}$ is a specific heat capacity of a solid with a unit of J/kg; $k_{eff}$ is an effective thermal conductivity of the bed with a unit of W/(m·s); $S_T$ is a source phase of the energy equation.

According to the method of the present invention, preferably, a calculation formula for the effective thermal conductivity $k_{eff}$ is:

$$k_{eff} = k_{eff,0} + 0.5 Pr Re k_g$$

$$k_{eff,0} = \phi(k_g + h_{rv}\Delta l) + \frac{(1-\phi)\Delta l}{1/(k_g/l_v + h_{rs}) + l_s/k_s}$$

where $k_{eff,0}$ is an effective thermal conductivity in the absence of fluid, with a unit of W/(m·s); Pr is Planck constant; Re is Reynolds number with a particle size of a solid particle as the characteristic length; $k_g$ is a thermal conductivity of a gas, with a unit of W/(m·K); $h_{rv}$ is an effective radiant heat exchange coefficient, with a unit of void, in W/($m^2$·K); $h_{rs}$ is an effective radiant heat exchange coefficient of a solid contact surface, with a unit of W/($m^2$·K); $\Delta l$ is a characteristic length between two solid particles, with a unit of mm; $l_s$ is an equivalent thickness of a fluid calculation layer, with a unit of mm; $k_s$ is a thermal conductivity of a solid, with a unit of W/(m·K); and $l_v$ is a thickness of a gas-solid contact layer, with a unit of mm.

According to a method of the present invention, preferably, the momentum equation is:

$$\frac{\partial(\phi \rho_g u)}{\partial t} + div(\phi \rho_g u u) = -\nabla P - \frac{\mu u}{K} - \beta \rho_g u^2$$

where, where P is a pressure of a gas, with a unit of Pa; K is a permeability of a porous medium, with a unit of %; and $\beta$ is traction coefficient.

According to a method of the present invention, preferably, the component equation includes a component equation of gas phase and a component equation of solid phase, the component equation of gas phase is:

$$\frac{\partial(\phi \rho_g Y_{ig})}{\partial t} + div(\phi \rho_g u Y_{ig}) = div(D_{ig} \nabla Y_{ig}) + S_{Y_{ig}},$$

where $Y_{ig}$ is a mass fraction of the i-th gas component in a mixed gas; $D_{ig}$ is a diffusion coefficient of the i-th gas component in the mixed gas, with a unit of $m^2$/s; $S_{Y_{ig}}$ is a source phase of a corresponding component;

the component equation of solid phase is:

$$\frac{\partial \rho_{is}}{\partial t} = r_{is}$$

where $\rho_{is}$ is a density of the i-th component in a solid particle, with a unit of $kg/m^3$; and $r_{is}$ is a reaction rate of the i-th component in a solid particle, with a unit of $kg/(m^3 \cdot s)$.

According to a method of the present invention, preferably, a mass transfer equation of an upper boundary layer of the bed to the exterior is:

$$D_g A \frac{\partial Y_g}{\partial x}\bigg|_s = A h_s (Y_\infty - Y_{g,s})$$

where A is an area of a bed interface, with a unit of $m^2$; $D_g$ is a diffusion coefficient of a gas, with a unit of $m^2$/s; $h_s$ is a gas-solid two-phase mass transfer coefficient, with a unit of m/s; $Y_\infty$ is a mass fraction of a gas component in the hearth; and $Y_{g,s}$ is a mass fraction of the gas component in the upper boundary layer;

the heat transfer equation of an upper boundary layer of a bed to the exterior is:

$$k_{eff} A \frac{\partial T}{\partial x}\bigg|_s = A h_T (T_\infty - T_{s1}) + A \varepsilon \sigma (T_{rad}^4 - T_{s1}^4)$$

where $k_{eff}$ is an effective thermal conductivity of the bed, with a unit of W/(m·s); $h_T$ is a heat transfer coefficient, with a unit of W/(m²·K); $T_\infty$ is a temperature in the hearth, with a unit of K; $T_{rad}$ is radiation temperature, with a unit of K; $T_{s1}$ is temperature of the upper boundary layer, with a unit of K; ε is a radiation coefficient; ε is 0.8; σ is Boltzmann's constant.

According to a method of the present invention, preferably, the mass transfer equation of a lower boundary layer of a bed to the exterior is:

$$D_g A \frac{\partial Y_g}{\partial x}\bigg|_s = A h_s (Y_{in} - Y_{g,s})$$

where $D_g$ is a diffusion coefficient of a gas, with a unit of m²/s; $h_s$ is a mass transfer coefficient with a unit of m/s; $Y_{in}$ is a mass fraction of the component gas in the exterior; and Ys is a mass fraction of the component gas in the lower boundary layer;

the heat transfer equation of the lower boundary layer of the bed to the exterior is:

$$k_{eff} A \frac{\partial T}{\partial x}\bigg|_s = A h_T (T_{in} - T_{s2}) + A\varepsilon\sigma (T_{in}^4 - T_{s2}^4)$$

where $k_{eff}$ is the effective thermal conductivity of the bed, with a unit of W/(m·s); $h_T$ is a heat transfer coefficient, with a unit of W/(m²·K); $T_{in}$ is temperature of the exterior, with a unit of K; $T_{s2}$ is temperature of the lower boundary layer, with a unit of K.

According to another aspect of the present invention, a device for calculating combustion in a waste incinerator bed is provided, the device may be used by applying the method as described previously, and the device includes: a data receiving module for receiving initial condition data; a data inputting module for inputting the initial condition data into a governing equation of a model of combustion in a waste incinerator bed; a calculation processing module for calculating the governing equation to obtain a calculation result; and a result display module for displaying the calculation result.

According to yet another aspect of the present invention, an apparatus for calculating combustion in a waste incinerator bed is provided, the apparatus may be used by applying the method as described previously, and the apparatus includes: a memory for storing a computer program; a processor for running the computer program stored in the memory, to execute the method as described previously.

According to yet another aspect of the present invention, a computer-readable storage medium is provided, on which computer program instructions are stored, the computer program instructions, when executed by the processor, implement the method as described previously.

By applying the method of the present invention, N and S trace elements in a waste component are fully taken into account, the generation of $NO_X$ and $SO_X$ pollutants may be simulated and calculated, resulting in an expanded application. Further, by applying the method of the present invention, the reaction of a gas component and a water vapor may be taken into account, therefore, the calculation accuracy is higher based on the method of the present invention, when an incineration process of municipal solid waste with a higher water content is simulated. According to a preferred technical scheme of the present invention, in the method of the present invention, conditions of an upper boundary and a lower boundary are set as heat transfer equations and mass transfer equations to exterior, which are more consistent with actual combustion conditions. In sum, by applying the method of the present invention, the calculation accuracy of an incineration condition of a waste bed may be improved.

DESCRIPTION OF REFERENCE SIGNS

1—waste, 2—grate, 3—burner, 4—hearth, 5—initial waste particle, 6—ash, 10—upper boundary layer, 20—lower boundary layer, 30—bed combustion region.

DETAILED DESCRIPTION

The present invention will be further described below with reference to specific embodiments, however, the protection scope of the present invention is not limited thereto.

Figure 1:
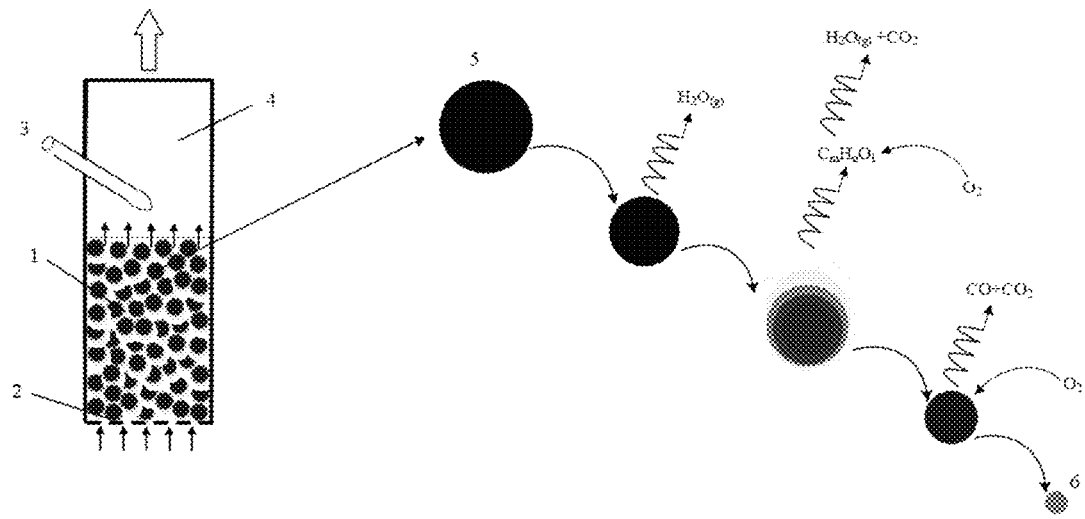
FIG. 1 is a schematic diagram of an incineration process of solid particles in a waste according to the present invention.

FIG. 1 is a schematic diagram of an incineration process of solid particles in a waste according to the present invention, the left side of FIG. 1 shows an incinerator, where a waste 1 is stacked on a grate 2 in a hearth 4, a burner 3 is arranged in the hearth 4, primary air is sent below the grate 2, a flue gas is discharged from an exhaust port above the hearth 4, the waste of a bed has a certain thickness, and the bed has an upper boundary and a lower boundary. The right side of FIG. 1 shows a process by which a waste is incinerated by initial waste particles 5 to an ash 6, the combustion of the waste in the bed is essentially a combustion of a porous medium formed by a solid waste stacked on the grate, the combustion process includes four sub-processes of moisture evaporation, volatile matter analysis, volatile matter combustion, and fixed carbon oxidation.

Figure 2:
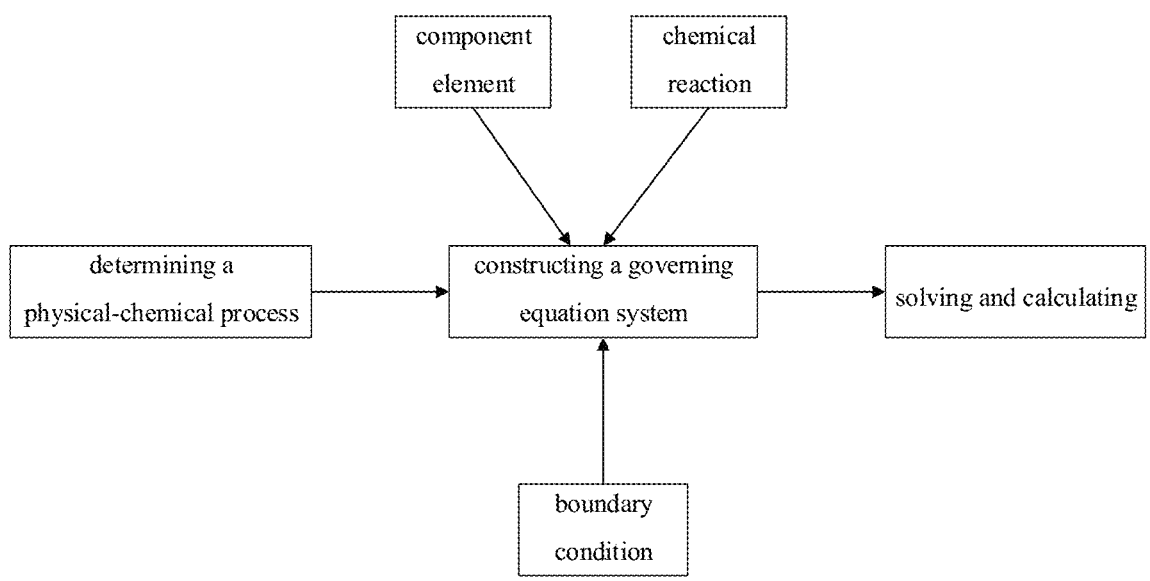
FIG. 2 is a schematic diagram of a modeling process for a combustion model of a bed of a waste incinerator according to the present invention.

FIG. 2 is a schematic diagram of a modeling process for a combustion model of a bed of a waste incinerator according to the present invention. Referring to FIG. 2, according to the present invention, following measures are mainly adopted, to make up shortcomings of existing models in a targeted manner:

① adding trace elements N and S to waste component elements;

② increasing the chemical reaction between volatile matter and water vapor;

③ setting boundary conditions of a model as heat and mass transfer conditions to the exterior.

The technical schemes of the present invention are described in detail below. According to common technical terminology in the existing field, "municipal solid waste" is abbreviated as "waste" in some places below, and such abbreviation does not result in indefiniteness for those skilled in the art.

<Model of Combustion in a Bed of a Waste Incinerator>

A model of combustion in a bed of a waste incinerator according to the present invention includes a moisture evaporation model, a volatile matter analysis model, a volatile matter combustion model, and a fixed carbon combustion model, where by using the four models, a full process of waste incineration is formed.

<Moisture Evaporation Model>

After entering in an incinerator, a municipal solid waste is firstly heated by radiation in the incinerator and is subjected to heat exchange with a high-temperature gas, and the reaction rate equation is as follows:

$$R_{evp} = A_s h_s (C_{w,s} - C_{w,g})$$

where $R_{evp}$ is an evaporation rate of moisture, $(kg/(m^3 \cdot s))$, $A_s$ is an surface area of a calculation volume, in $(m^2)$, $C_{w,s}$ and $C_{w,g}$ are water vapor concentrations of a solid particle surface and a gas phase portion, respectively, and $h_s$ is a gas-solid two-phase mass transfer coefficient, in (m/s);

$$C_{w,s} = \frac{P_{w,s}}{1000RT}$$

$$P_{w,s} = \exp\left(20.386 - \frac{5132}{T}\right) \times 133.322$$

where $P_{w,s}$ is a partial pressure of surface water of solid particles (Pa), R is an ideal gas constant $(J/(mol \cdot K))$, T is temperature (K). The gas-solid mass transfer coefficient $h_s$ may be calculated from the Thank number (Sh) and the Schmitt number (Sc) as follows:

$$h_s = Sh \times D_g / d_p$$

$$Sh = 2 + 1.1 Sc^{0.33} Re^{0.6}$$

$$Sc = \mu / \rho_0 D_g$$

where $D_g$ is a diffusion coefficient of a gas, in $(m^2/s)$, $d_p$ is a particle size of a solid particle (m), Re is the Reynolds number based on the particle size of the particle as the characteristic length, $Re = \rho_g U d_p / \mu$, where $\mu$ is a dynamic viscosity coefficient of a gas, in $(Pa \cdot s)$.

The calculation formula of the diffusion coefficient $D_g$ is as follows:

$$D_g = D_g^e + 0.5 \cdot d \cdot \mu$$

where $D_g^e$ is a diffusion coefficient in the absence of fluid, which may be calculated using a binary diffusion coefficient as follows:

$$D_{ij} = \frac{0.00186 T^{1.5}}{p \sigma_{ij}^2 \Omega} \sqrt{\frac{1}{M_i} + \frac{1}{M_j}}$$

where i represents a computing component and j represents another component other than the component i.

<Volatile Matter Analysis Model>

Volatile matter in a waste component may be cracked into small molecular gases under a condition of heating, and a reaction rate equation is:

$$R_v = A_v \exp\left(-\frac{E_v}{RT}\right) \rho_s Y_v$$

where $R_v$ is a rate in $(kg/(m^3 \cdot s))$, $E_v$ is the activation energy of a waste pyrolysis, $E_v = 6.9 \times 10^7$ (J/kmol), $A_v$ is a pre-factor of a waste pyrolysis rate, $A_v = 3.4 \times 10^4$; R is the ideal gas constant; T is reaction temperature in (K); $\rho_s$ is an apparent density of a solid waste, in $(kg/m^3)$; $Y_v$ is a mass ratio of volatile matter in a solid waste.

<Volatile Matter Combustion Model>

In the present model, volatile matters volatilized from a waste include CO, $H_2$, $CH_4$, $NH_3$, and $H_2S$. Combustion reaction equations and reaction rates of volatile matters of the present model are shown in Table 1. The reaction rate constants are all calculated according to the Arrhenius equation, as follows:

$$k = AT^b \exp\left(-\frac{E}{RT}\right)$$

TABLE 1

Combustion Reaction Equations and Reaction Rates of Volatile matters with $O_2$

| chemical reaction | A | b | E | reaction order |
| --- | --- | --- | --- | --- |
| $H_2 + 0.5O_2 \rightarrow H_2O$ (g) | $6.8 \times 10^{15}$ | −1 | $1.67 \times 10^8$ | $[H_2]^{0.25}[O_2]^{1.5}$ |
| $CH_4 + 1.5O_2 \rightarrow CO + 2H_2O$ (g) | $5.012 \times 10^{11}$ | 0 | $2 \times 10^8$ | $[CH_4]^{0.7}[O_2]^{0.8}$ |
| $CO + 0.5O_2 \rightarrow CO_2$ | $2.239 \times 10^{12}$ | 0 | $1.702 \times 10^8$ | $[CO][O_2]^{0.25}[H_2O]^{0.5}$ |
| $NH_3 + O_2 \rightarrow NO + 0.5H_2 + H_2O$ (g) | $1.21 \times 10^5$ | 2 | $6.65 \times 10^7$ | $[NH_3][O_2]^{0.5}[H_2]^{0.5}$ |
| $H_2S + 1.5O_2 \rightarrow SO_2 + H_2O$ (g) | $6.5 \times 10^5$ | 0 | $8.97 \times 10^7$ | $[H_2S][O_2]$ |

In addition to the combustion reaction equations of CO, $H_2$, $CH_4$, $NH_3$, and $H_2S$ with $O_2$ in Table 1, in the present model, reaction equations of volatile matters with water vapor are also included, specifically the reaction equations for CO and $CH_4$ with water vapor, respectively, as shown in Table 2.

TABLE 2

Reaction Equations and Reaction Rates of Volatile matters with $H_2O$

| chemical reaction | A | b | E | reaction order |
| --- | --- | --- | --- | --- |
| $CH_4 + H_2O \rightarrow CO + 3H_2$ | $3 \times 10^{11}$ | 0 | $1.26 \times 10^8$ | $[CH_4][O_2]$ |
| $CO + H_2O \rightarrow CO_2 + H_2$ | $2.75 \times 10^{12}$ | 0 | $8.4 \times 10^7$ | $[CO][H_2O]$ |

Based on this, chemical reactions of selected gas phase components CO, $H_2$, $CH_4$, $NH_3$, and $H_2S$ with $O_2$, respectively, as well as chemical reactions of CO, $CH_4$ with water vapor, respectively, construct a volatile matter combustion model of gas phase combustion of the waste according to the present invention.

<Fixed Carbon Combustion Model>

The coefficient of volatile matter represents the process of waste carbonization, and the fixed carbon may be ignited after the volatilization is completed. Since it is a combustion reaction, in which the oxidation reaction of the carbon is taken into account, the chemical equation is as follows:

$$C_{(s)} + \alpha O_2 \rightarrow 2(1-\alpha)CO + (2\alpha-1)CO_2$$

where α is the coefficient of oxygen actually participating in the reaction, which is related to the generation ratios of CO and $CO_2$, and which may be written as a function of current temperature T, as follows:

$$CO/CO_2 = 2500\exp(-6240/T)$$

the reaction rate is:

$$R_c = P_{O_2}/(1/k_r + 1/k_d)$$

where α is a consumption coefficient of oxygen, $R_t$ is a consumption rate of the fixed carbon, in (kg/(m³ s)), $P_{O_2}$ is the partial pressure of oxygen, $k_r$, $k_d$ are chemical reaction rate coefficients and oxygen diffusion coefficients, respectively, the chemical reaction parameter $k_r$ dominates the reaction rate, $$k_r = A_c \exp\left(-\frac{E_c}{RT}\right),$$

where $A_c$=3 kg/(in s kPa), $E_c/R$=10300

<Governing Equations>

The governing equations according to the present invention are N-S(Navier-Stokes equations) equations established for a solid phase and a gas phase, respectively, based on three laws of conservation of mass, conservation of momentum, and conservation of energy, and describe combustion phenomena such as flow, diffusion, and reaction of the solid phase and the gas phase in a calculation area in a bed of a waste. The governing equations include a continuity equation, a momentum equation, an energy equation, and a component equation, which are specifically described as follows.

<Continuity Equation>

The continuity equation is the mass conservation equation, and the equation of a gas phase part is:

$$\frac{\partial(\phi\rho_g)}{\partial t} + div(\phi\rho_g u) = S_g$$

the equation for a solid phase part is:

$$\frac{\partial \rho_s}{\partial t} = -S_g$$

where φ is a void fraction (%), $\rho_g$ is a density of a gas, in (kg/m³), u is a flow rate of a gas (m/s), $\rho_s$ is a density of a solid, in (kg/m³), $S_g$ is a source phase of the gas phase continuity equation, the value of which is the sum of reaction rates of solid phase to gas phase reactions (including moisture evaporation, volatile matter precipitation, and fixed carbon oxidation).

<Momentum Equation>

The flow of fluid in a porous medium is primarily affected by pressure, adhesive force, gas-solid surface traction force, and self-gravity. Due to that the fluid is a gas, the influence of the self-gravity is neglected, and the adhesive force and the gas-solid surface traction force are calculated by adopting an Ergun formula, to obtain a momentum governing equation as follows:

$$\frac{\partial(\phi\rho_g u)}{\partial t} + div(\phi\rho_g uu) = -\nabla P - \frac{\mu u}{K} - \beta\rho_g u^2$$

where P is the pressure of a gas, in (Pa), K is the permeability of a porous medium, β is a traction coefficient, and the calculation formulae are as follows:

$$\frac{1}{K} = 150\frac{(1-\phi)^2}{\phi^3 d_p^2}$$

$$\beta = \frac{1.75(1-\phi)}{d_p \phi^3}$$

<Energy Equation>

The energy equation is the thermal equilibrium equation of a system, including three parts for material heat conduction, convection heat dissipation and reaction endotherm and exotherm. In the present invention, assuming that the temperature in a same computing unit is uniform and the temperature of both a gas phase and a solid phase are the same, the energy equation is as follows:

$$\frac{\partial(\phi\rho_g C_{pg}T + (1-\phi)\rho_s C_{ps}T)}{\partial t} + div(\phi\rho_g u C_{pg}T) = div(k_{\mathit{eff}}\nabla T) + S_T$$

where $C_{ps}$ is a specific heat capacity of a solid, in (J/kg), $C_{pg}$ is a specific heat capacity of a gas, in (J/kg), $k_{\mathit{eff}}$ is an effective thermal conductivity of a bed, in (W/(m·s)), and $S_T$ is the source phase of the energy equation.

In the effective thermal conductivity $k_{\mathit{eff}}$, the thermal conductivity of a gas and a solid is comprehensively taken into account, as well as the radiant heat between solid particles, and the calculation formula is:

$$k_{\mathit{eff}} = k_{\mathit{eff},0} + 0.5 PrRe k_g$$

$$k_{\mathit{eff},0} = \phi(k_g + h_{rv}\Delta l) + \frac{(1-\phi)\Delta l}{1/(k_g/l_v + h_{rs}) + l_s/k_s}$$

where $k_{\mathit{eff},0}$ is an effective thermal conductivity in the absence of fluid, in (W/(m·s)), Re is the Reynolds number with a particle size of a solid particle as the characteristic length; $h_{rv}$ is an effective radiant heat transfer coefficient in void (W/(m²·K)), $h_{rs}$ is an effective radiant heat transfer coefficient of a solid contact surface (W/(m²·K)), Δl is a characteristic length between two solid particles (mm), $l_s$ is the equivalent thickness of a fluid calculation layer, in (mm), $k_s$ is a thermal conductivity of a solid, in (W/(m·K)), and $l_v$ is the thickness of a gas-solid contact layer, in (mm).

<Component Equation>

The component equation is essentially a single-component continuity equation in a gas or a solid, the component equation of a gas phase part is:

$$\frac{\partial(\phi\rho_g Y_{ig})}{\partial t} + div(\phi\rho_g u Y_{ig}) = div(D_{ig}\nabla Y_{ig}) + S_{Y_{ig}}$$

where $Y_{ig}$ is a mass fraction of an i-th gas component in a mixed gas, gas components in the mixed gas includes $N_2$, $O_2$, $CH_4$, $CO$, $CO_2$, $H_2$, $NH_3$, $H_2S$, $SO_2$, $NO$, and $H_2O$; $D_{ig}$ is a diffusion coefficient of a corresponding gas component, in (m²/s), and $S_{Y_{ig}}$ is a source phase of a corresponding component;

the component equation of a solid phase part is:

$$\frac{\partial \rho_{is}}{\partial t} = r_{is}$$

where $\rho_{is}$ is a density of an i-th component in a solid particle, in (kg/m³), i represents moisture, volatile matter, fixed carbon and ash in a solid particle, and $r_{is}$ is a reaction rate of a corresponding component, in (kg/(m³·s)).

<Boundary Condition>

Figure 3:
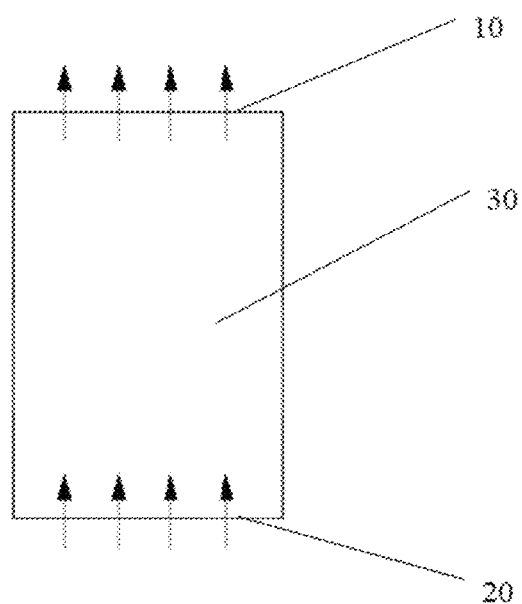
FIG. 3 is a calculation area for a combustion in a bed of a waste incinerator according to the present invention.

FIG. 3 shows a bed combustion area of a model according to the present invention, the direction of arrows points to the outlet of a flue gas, a waste is in contact with the exterior at an upper boundary layer 10 and a lower boundary layer 20 of the bed combustion, the bed combustion area 30 transfers heat and mass with a hearth at the upper boundary layer 10, the bed combustion area 30 transfers heat and mass with the bottom at the lower boundary layer 20, therefore boundary conditions are the heat and mass transfer equations of the upper and lower boundary layers to the exterior.

<Upper Boundary Condition>

The upper boundary of the waste incineration bed is in contact with the waste hearth, the pressure boundary is set to atmospheric pressure, the velocity boundary is set to be gradient zero, and the mass transfer boundary find expression in the boundary condition equation of the component equation as follows:

$$D_g A \frac{\partial Y_g}{\partial x}\bigg|_s = A h_s (Y_\infty - Y_{g,s})$$

where A is an area of a bed interface, in (m²), $D_g$ is a diffusion coefficient of a gas, in (m²/s), $h_s$ is a mass transfer coefficient, in (m/s), $Y_\infty$ is a mass fraction of a component gas in a hearth, and $Y_{g,s}$ is a mass fraction of a component gas in an upper boundary layer.

The heat transfer boundary is as follows:

$$k_{eff} A \frac{\partial T}{\partial x}\bigg|_s = A h_T (T_\infty - T_{s1}) + A\varepsilon\sigma(T_{rad}^4 - T_{s1}^4)$$

where $k_{eff}$ is an effective thermal conductivity coefficient of a bed, in (W/(m·s)), $h_T$ is a heat transfer coefficient in (W/(m²·K)), $T_\infty$ is temperature in a hearth, in (K), $T_{rad}$ is radiation temperature in (K), $T_{s1}$ is temperature of an upper boundary layer, in (K), ε is a radiation coefficient, ε is 0.8, σ is the Boltzmann's constant.

The heat transfer coefficient $h_T$ may be calculated by the Planck constant (Pr) and the Knoop number (Nu), as follows:

$$h_T = Nu \times k_g / d_p$$

$$Nu = 2 + 1.1 Pr^{0.33} Re^{0.6}$$

$$Pr = \frac{\mu C_{pg}}{k_g}$$

where $k_g$ is a thermal conductivity coefficient of a gas, in (W/(m·K)), $C_{pg}$ is a specific heat capacity of a gas, in (J/(kg·K)), $d_p$ is a particle size of a solid particle, in (m).

<Lower Boundary Condition>

The lower boundary of a waste incineration bed is in contact with the exterior, the pressure boundary is set to atmospheric pressure, the velocity boundary is set to a constant, and the mass transfer boundary find expression in the boundary condition equation of the component equation as follows:

$$D_g A \frac{\partial Y_g}{\partial x}\bigg|_s = A h_s (Y_{in} - Y_{g,s})$$

where $D_g$ is a diffusion coefficient of a gas, in (m²/s), $h_s$ is a mass transfer coefficient in (m/s), $Y_{in}$ is a mass fraction of a component gas in the exterior, and $Y_{g,s}$ is a mass fraction of a component gas in a lower boundary layer;

the heat transfer boundary is as follows:

$$k_{eff} A \frac{\partial T}{\partial x}\bigg|_s = A h_T (T_{in} - T_{s2}) + A\varepsilon\sigma(T_{in}^4 - T_{s2}^2)$$

where $k_{eff}$ is an effective thermal conductivity of a bed, in (W/(m·s)), $h_T$ is a heat transfer coefficient in (W/(m²·K)), $T_{in}$ is temperature of exterior (K), and $T_{s2}$ is temperature of a lower boundary layer (K).

<Model Solution>

In the present application, all governing equations include four terms of a transient term, a convection term, a diffusion phase, and a source phase (the convection term and the diffusion phase do not exist in a portion of equations, which may be seen as a correlation coefficient of zero), and all governing equations may be written into a generic format equation, as follows:

$$\frac{\partial (\rho \Phi)}{\partial t} + div(\rho u \Phi) = div(\lambda \nabla \Phi) + S_\Phi$$

where ρ is a density, u is a velocity, λ is a diffusion coefficient, φ is a solved variable, and $S_\phi$ is a corresponding source phase. The discretization of the governing equation may adopt a finite volume method, a bed calculation area is divided into a limited number of calculation volumes, all the governing equations are discretized into each finite volume, during the discretization process, a central differential format is used for the convection term, and a full implicit mode is adopted for the diffusion phase, linear processing is adopted for the source phase, so that each control equation may be discretized into the form of a linear matrix, and a SIMPLE algorithm is adopted for programming and solving. The finite volume method and the SIMPLE algorithm are algorithms known in computational fluid mechanics, and the principles and processes thereof are not repeated here. The computational process according to the present invention may be calculated and solved by writing Code BASIC (Bulk Accumulated Solids Incineration Code) by means of a MATLAB programming platform.

By applying the model of the present invention, a combustion process of a bed of a waste incinerator is calculated, input for calculation includes element analysis data, industrial analysis data, Lower Heating Value (LHV) and size data of a waste raw material, in addition, input for calculation also includes a primary air volume, initial exterior temperature, the amount of a waste fed into a furnace, the equivalent spherical diameter of a waste size, a stacking bed height, an apparent density, a void fraction, a high-temperature radiant heat source at the top of a hearth and a radiation rate of a waste bed. Further, output for calculation includes distributions of a temperature field, a concentration field of each substance, a pressure field, and a flow field during incineration of a waste in a bed. Since elements N and S in a waste component are taken into account in the method of the present invention, output results include concentration fields of $NO_X$, and $SO_X$ contaminants.

Note that, for a same calculation model, different programming platforms and different program statements may be used for programming calculation. The present invention does not limited to a specific programming calculation scheme. As long as it is a method that may solve and calculate the model and obtain the calculation results, the method may be used.

Embodiment 1

In the present invention, experimental verification is carried out on a model of combustion in a bed of a waste incinerator according to the present invention in a form of comparison of experimental data with simulation calculation data of the model according to the present invention. Initial parameters for the model of combustion in a bed of a waste incinerator according to the present invention are set to be consistent with experimental data, and the mass of a solid and the concentrations of various gas components in simulation results are compared with experimental measured values.

The experimental data is the experiment data of waste incineration of a fixed bed incinerator. The incineration of a waste in a furnace has the characteristics of stacked materials and conforms to the simulation conditions of the model according to the present invention; further, it is relatively easy to control a fixed bed equipment, and it is easy to perform a detection under laboratory conditions. The details are described below.

(1) Experimental Apparatus

The fixed bed has an inner diameter of 0.2 m and a total height of 1.5 m, and has a plurality of ventilation holes at a bottom of a grate with the diameter of 2 mm and accounting for 7% of the whole grate area; primary air passes through an air pump, a flowmeter and a preheating system, which enters from a bottom grate and provides oxygen for incineration of a solid waste; secondary air is introduced from the top and provides oxygen for ignition of a combustor, and the combustor is arranged at 750 mm above the grate; solid waste is stacked in an lower area in the fixed bed (as a simulation calculation area), and a thermocouple is arranged in the area to detect temperature change of the experiment; a gas collection device is arranged at the height of 430 mm from the height of the grate, the component analysis of a flue gas is carried out through a flue gas analyzer and a data collection system, and the gas components, such as $O_2$, $CO_2$, CO and the like may be analyzed and detected, finally, the results of detection and analysis may be used to be compared with simulation computation data of the model according to the present invention.

(2) Analysis of Raw Materials

The experimental materials used in the experiment are raw wastes with an average calculation size of 12 mm, and industrial analysis and element analysis of the raw materials are shown in Table 3:

TABLE 3

Element Analysis and Industrial Analysis of Raw Wastes

| elemental analysis (%) | | | | | industrial analysis (%) | | | LHV (kJ/kg) |
|---|---|---|---|---|---|---|---|---|
| C | H | O | N | S | mois-ture | volatile matter | fixed carbon | ash | |
| 28.6 | 3.3 | 29.8 | 0 | 0 | 35.0 | 53.3 | 8.4 | 3.3 | 9000 |

According to data in Table 3 and the calculation method of volatile matters in the present invention, the volatile matters and the component gases thereof may be calculated as follows:

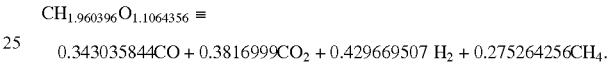

$CH_{1.960396}O_{1.1064356} \equiv$
$0.343035844 CO + 0.3816999 CO_2 + 0.429669507 H_2 + 0.275264256 CH_4$.

(3) Initial Conditions

The initial conditions set in the model according to the present invention are consistent with experimental conditions, the initial conditions are set as follows: primary air volume u=200 l/min, initial exterior temperature $T_{in}$=15° C., amount of waste fed into furnace 2.02 kg, equivalent spherical diameter of waste size D=12 mm, stacking bed height H=480 mm, apparent density $\rho_c$=137 kg/m³, void fraction set to $\phi$=0.65, high temperature radiant heat source at the top of hearth set to $T_{rad}$=1173 K, and radiation rate of waste bed set to $\varepsilon$=0.8.

(4) Verification Results

1) Solid Mass

Figure 4:
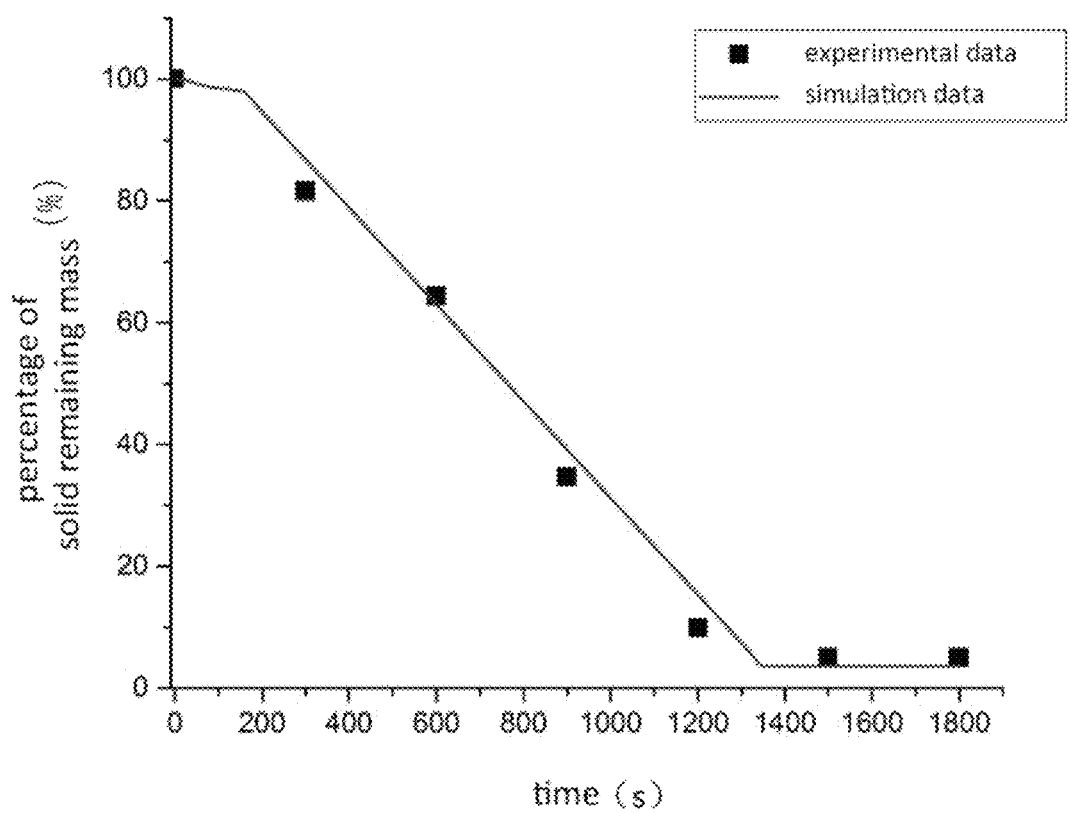
FIG. 4 is a graph of percentages of residual mass of solid wastes in a bed.

FIG. 4 is a graph of percentages of residual mass of solid wastes in a bed, where the horizontal axis shows reaction time, the vertical axis shows percentages of residual mass of a solid (%), the curve shows simulation data, and the points show experimental data. As may be seen from FIG. 4, simulation results are well matched with experimental data and their trends are consistent.

2) Temperature Distribution

Figure 5:
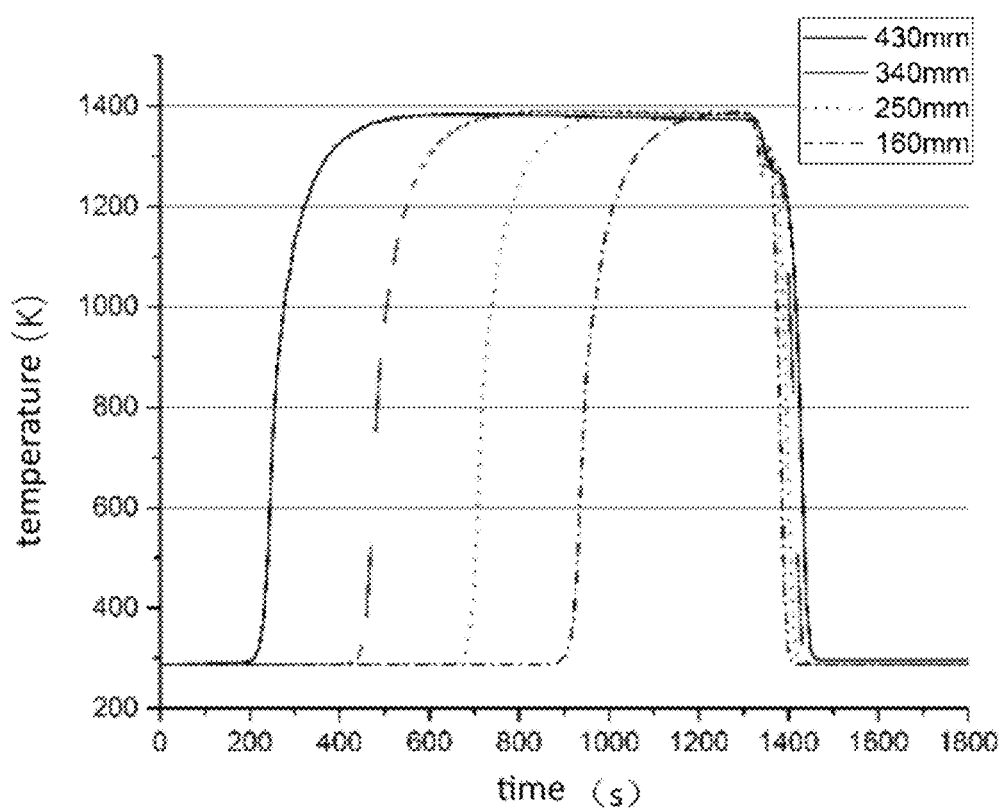
FIG. 5 is a curve graph of temperature at different height positions of a bed.

FIG. 5 is a curve graph of temperature at different height positions of a bed, the height is selected at 430 mm, 340 mm, 250 mm, and 160 mm above a grate, respectively. In FIG. 5, the horizontal axis shows combustion time, the vertical axis shows temperature. Temperature rise time at different positions of the bed is different, since a high-temperature radiation comes from the hearth at the top of the bed, the waste solid at the top initially heats up. As may be seen from FIG. 5, the 430 mm height begins to warm at 200 s, the 340 mm height begins to warm at 420 s, the 250 mm height begins to warm at 680 s, the 160 mm height begins to warm at 900 s, at the last, after 1450 s, all of them are cooled to the temperature of the primary air.

Figure 6:
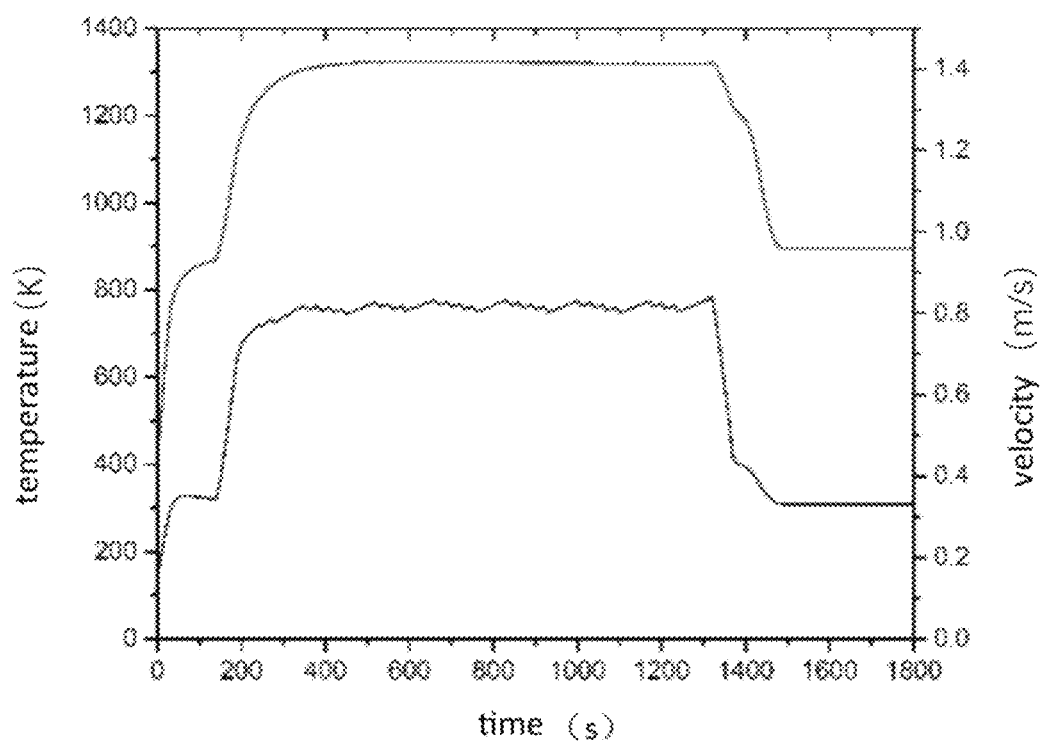
FIG. 6 is a curve graph of temperature variations and velocity variations at the top of a calculation area.

FIG. 6 is a curve graph of temperature variations and velocity variations at the top of a calculation area. As may be seen, the trend of the velocity curve is consistent with that of the temperature curve. When the top layer burns stably, the temperature is about 1300 K, the flow rate of the gas fed into furnace is 0.1065 m/s, and the steady-state flow rate is about 0.8 m/s.

3) Oxygen Concentration

Figure 7:
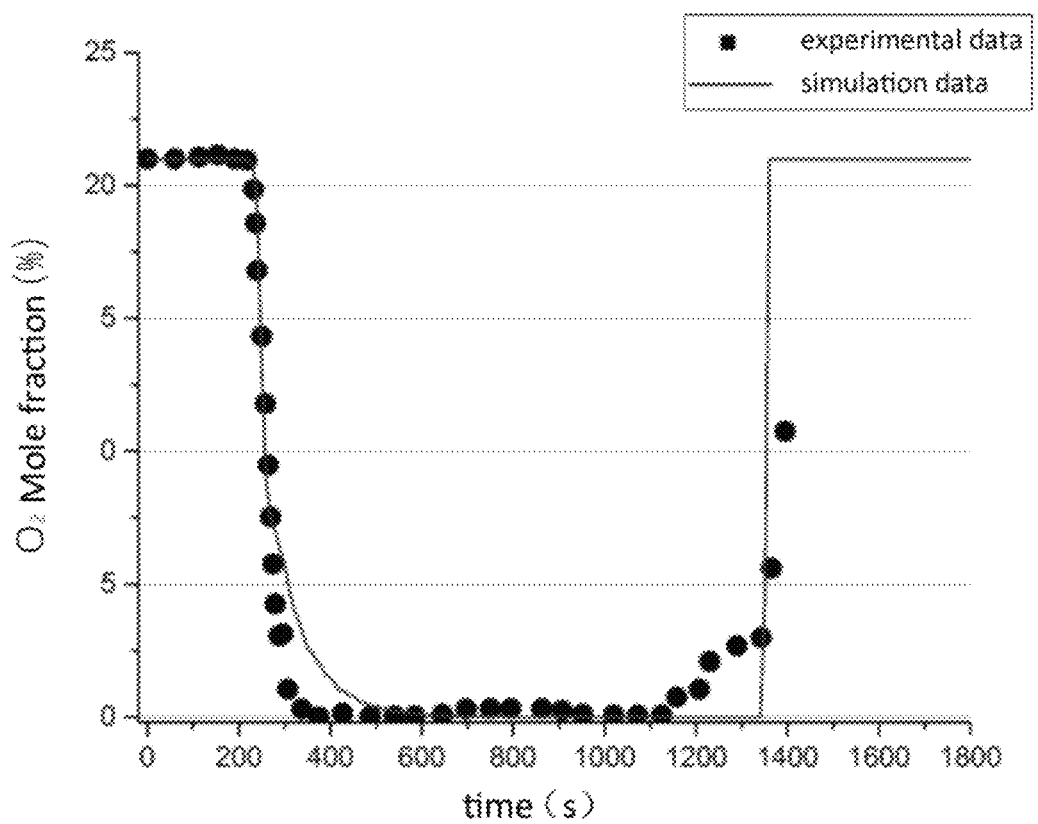
FIG. 7 is a comparison chart of calculation results versus experimental results for oxygen concentration at 430 mm.

FIG. 7 is a comparison of calculation results versus experimental results for oxygen concentration at 430 mm, in which the curve shows simulation results, and the points show experimental results. From the curve, it may be seen that the predicted value is very close to the experimental value, while the four stages of non-ignition, ignition, stable combustion and burnout of waste are shown; before ignition, the mole fraction of oxygen is 21% of the air concentration and is rapidly reduced after ignition; when the stable combustion state is achieved, the oxygen supply and the oxygen consumption are equal, the mole fraction of oxygen is maintained dynamic equilibrium at 0, the oxygen is no longer consumed after the fixed carbon and the gas phase combustible component are burned out, and the oxygen is rapidly recovered to the air concentration level.

4) $CO_2$ Concentration

Figure 8:
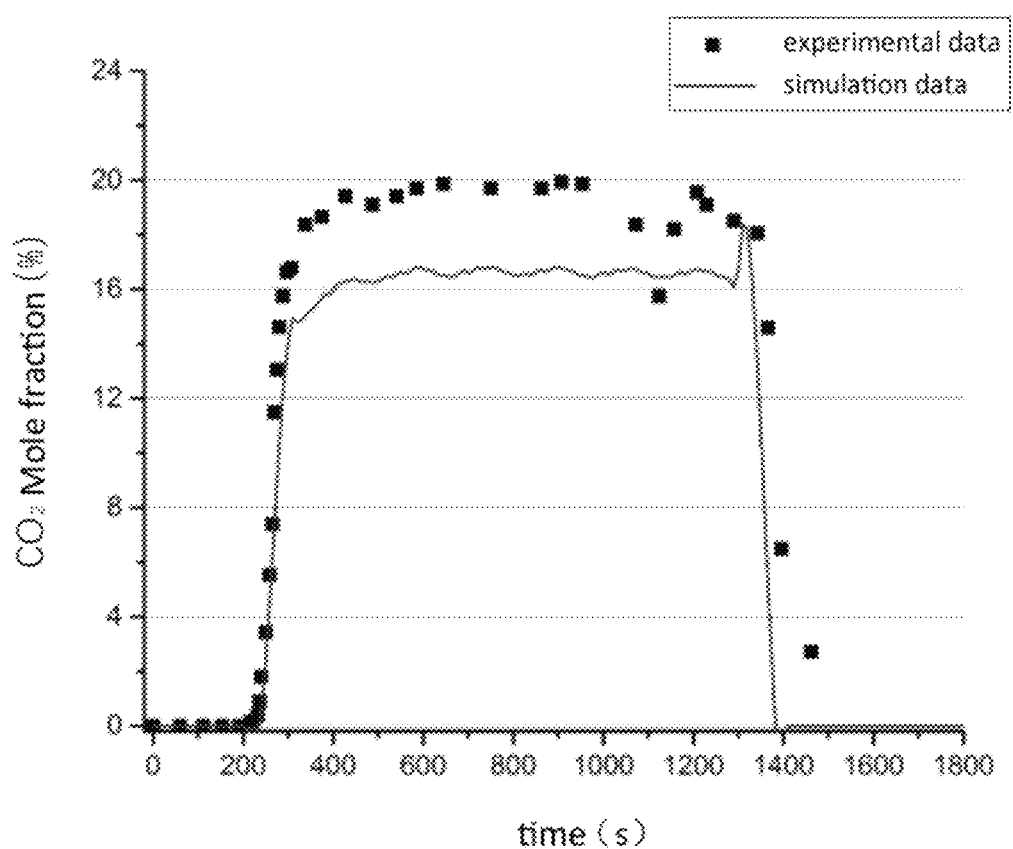
FIG. 8 is a comparison chart of calculation results versus experimental results for carbon dioxide concentration at 430 mm.

FIG. 8 is a comparison of calculation results versus experimental results for carbon monoxide concentration at 430 mm, in which the curve shows simulation results, and the points show experimental results. In FIG. 8, the change in $CO_2$ concentration is the same as that of oxygen, and both experience four stages of the non-ignition stage, the ignition stage, the stable combustion stage and the burnout stage, the simulation data and the experimental data are well matched at each stage, and the simulation data is approximately 3% lower than the experimental data at the stable combustion stage.

5) CO Concentration

Figure 9:
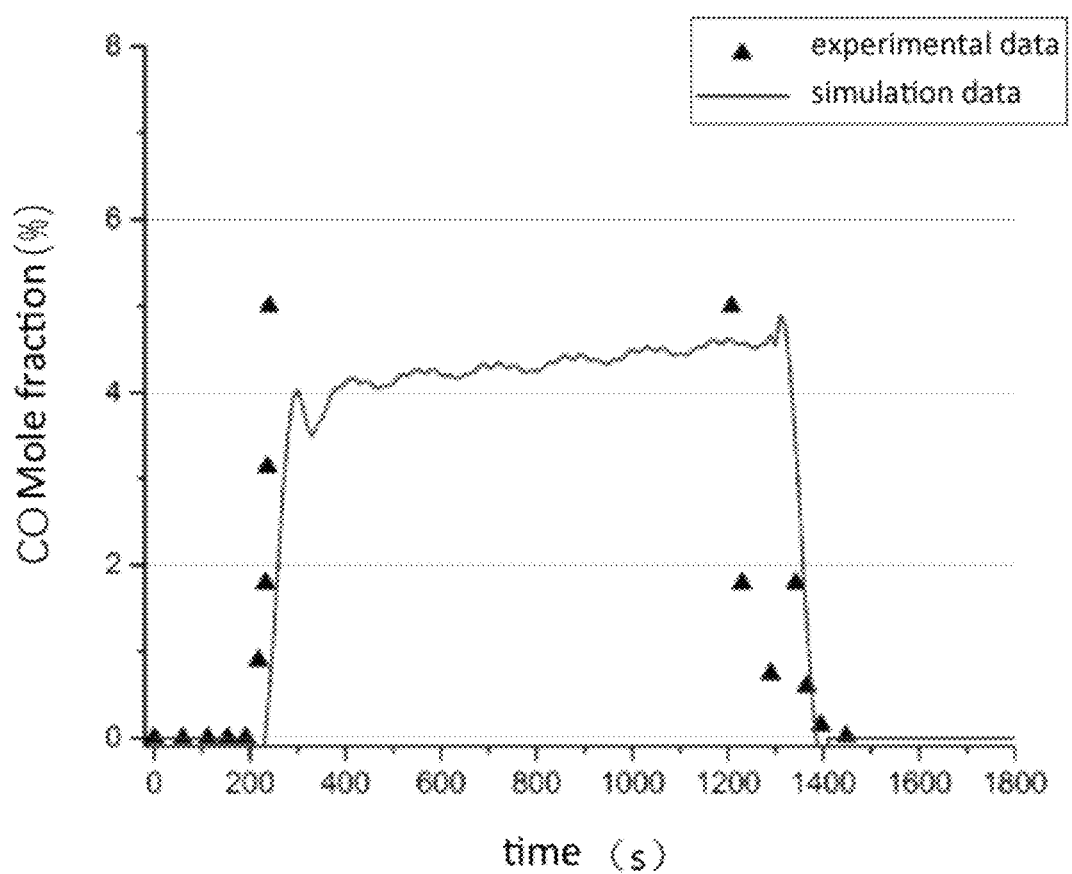
FIG. 9 is a comparison chart of calculation results versus experimental results for carbon monoxide concentration at 430 mm.

FIG. 9 is a comparison of calculation results versus experimental results for carbon monoxide concentration at 430 mm, in which the curve shows simulation results, and the points show experimental results. From FIG. 9, it may be seen that the simulation results have good correlation with experimental data.

The above verification results show that, in the case that simulation conditions are consistent with experimental conditions, the variation trend of a simulation curve for a solid mass, an oxygen concentration, a $CO_2$ concentration, and a CO concentration and the like in a bed is consistent with that of actual measurement data, and calculated values are very close to actual values, which proves that accurate calculation results are obtained by applying the method of the present invention.

The present invention is not limited to embodiments described above, and without departing from the essential contents of the present invention, any variations, improvements, and/or substitutions that may be conceived by those skilled in the art fall within the scope of the present invention.

What is claimed is:

1. A method for calculating combustion in a bed of a waste incinerator, wherein the method is based on a model of combustion in the bed of the waste incinerator, the method comprises:

receiving initial condition data;

inputting the initial condition data into a governing equation of the model of combustion in the bed of the waste incinerator;

calculating the governing equation to obtain a calculation result;

displaying the calculation result; wherein the model of combustion in the bed of the waste incinerator comprises a moisture evaporation model, a volatile matter analysis model, a volatile matter combustion model, and a fixed carbon combustion model; wherein volatile matters in the volatile matter combustion model comprise CO, $H_2$, $CH_4$, $NH_3$ and $H_2S$, the volatile matter combustion model comprises a combustion reaction equation for said volatile matter and $O_2$, and respective equations for CO and $CH_4$ of the volatile matter reacting with water vapor; the governing equation for the model of combustion in the bed of the waste incinerator comprise a continuity equation, an energy equation, a momentum equation, and a component equation; a boundary condition of said governing equation comprise: a equation of heat and mass transfer from an upper boundary layer of the bed to the exterior; and a equations of heat and mass transfer from a lower boundary layer of the bed to the exterior, and wherein the mass transfer equation of the upper boundary layer of the bed to the exterior is:

$$D_g A \frac{\partial Y_g}{\partial x}\bigg|_s = A h_s (Y_\infty - Y_{g,s})$$

wherein A is an area of a bed interface, with a unit of $m^2$; $D_g$ is a diffusion coefficient of a gas, with a unit of $m^2/s$, $h_s$ is a gas-solid two-phase mass transfer coefficient with a unit of m/s; $Y_\infty$ is a mass traction of a gas component in the hearth; and $Y_{g,s}$ is a mass fraction of a gas component in the upper boundary layer;

a heat transfer equation of the upper boundary layer of the bed to the exterior is:

$$k_{eff} A \frac{\partial T}{\partial x}\bigg|_s = A h_T (T_\infty - T_{s1}) + A \varepsilon \sigma (T_{rad}^4 - T_{s1}^4)$$

wherein $k_{eff}$ is an effective thermal conductivity of the bed, with a unit of W/(m·s), $h_T$ is a heat transfer coefficient, with a unit of W/(m²·K); $T_\infty$ is temperature in the hearth, with a unit of k; $T_{rad}$ is a radiation temperature with a unit of K; $T_{s1}$ is a temperature of the upper boundary layer, with a unit of K, $\varepsilon$ is a radiation coefficient, $\varepsilon$ is 0.8; $\sigma$ is the Boltzmann's constant.

2. The method according to claim 1, wherein the initial condition data comprises: element analysis data, industrial analysis data, a low heating value (LHV) and raw material size data of a target waste;

the calculation result comprises: a temperature distribution, a flow field distribution and a concentration distribution of gas components of the target waste in the bed during an incineration process, wherein the concentration distribution of gas components comprises concentration distributions of nitride and/or sulfide.

3. The method according to claim 1, wherein the continuity equation comprises a continuity equation of gas phase part and a continuity equation of solid phase part, the continuity equation of gas phase part is:

$$\frac{\partial (\phi \rho_g)}{\partial t} + div(\phi \rho_g u) = S_g$$

the continuity equation of solid phase part is:

$$\frac{\partial \rho_s}{\partial t} = -S_g$$

wherein $\phi$ is avoid fraction with a unit of %; $\rho_g$ is a density of a gas, with a unit of kg/m$^3$; t is time in s; u is a flow rate of the gas, with a unit of m/s; $\rho_s$ is a density of a solid, with a unit of kg/m$^3$; $S_g$ is a source phase of the continuity equation of gas phase.

4. The method according to claim 1, wherein the energy equation is:

$$\frac{\partial(\phi\rho_g C_{pg} T + (1-\phi)\rho_s C_{ps} T)}{\partial t} + div(\phi\rho_g u C_{pg} T) = div(k_{eff} \nabla T) + S_T$$

wherein T is reaction temperature, with a unit of K; $C_{pg}$ is a specific heat capacity of a gas, with a unit of J/kg; $C_{ps}$ is a specific heat capacity of a solid, with a unit of J/kg; $k_{eff}$ is an effective thermal conductivity of the bed, with a unit of W/(m·s); $S_T$ is a source phase of the energy equation.

5. The method according to claim 4, wherein a calculation formula for the effective thermal conductivity $k_{eff}$ is:

$$k_{eff} = k_{eff,0} + 0.5 Pr Re k_g$$

$$k_{eff,0} = \phi(k_g + h_{rv}\Delta l) + \frac{(1-\phi)\Delta l}{1/(k_g/l_v + h_{rs}) + l_s/k_s}$$

wherein $k_{eff,0}$ is an effective thermal conductivity in an absence of fluid, with a unit of W/(m·s); Pr is Planck constant; Re is Reynolds number with a particle size of a solid particle as a characteristic length; $k_g$ is a thermal conductivity of a gas, with a unit of W/(m·K); $h_{rv}$ is an effective radiant heat transfer coefficient in a void, with a unit of W/(m$^2$·K); s is an effective radiant heat transfer coefficient of a solid contact surface, with a unit of W/(m$^2$·K); $\Delta l$ is a characteristic length between two solid particles, with a unit of mm; $l_s$ is an equivalent thickness of a fluid calculation layer, with a unit of mm; $k_s$ is a thermal conductivity of a solid, with a unit of W/(m·K); and $l_v$ is a thickness of a gas-solid contact layer, with a unit of mm.

6. The method according to claim 1, wherein the momentum equation is:

$$\frac{\partial(\phi\rho_g u)}{\partial t} + div(\phi\rho_g uu) = -\nabla P = \frac{\mu u}{K} - \beta\rho_g u^2$$

wherein P is a pressure of a gas, with a unit of Pa; K is a permeability of a porous medium, with a unit of %; $\beta$ is a traction coefficient.

7. The method according to claim 1, wherein the component equation comprises a component equation of gas phase part and a component equation of solid phase part, the component equation of gas phase part is:

$$\frac{\partial(\phi\rho_g Y_{ig})}{\partial t} + div(\phi\rho_g u Y_{ig}) = div(D_{ig}\nabla Y_{ig}) + S_{Y_{ig}}$$

wherein $Y_{ig}$ is a mass fraction of an i-th gas component in a mixed gas; $D_{ig}$ is a diffusion coefficient of an i-th gas component in the mixed gas, with a unit of m$^2$/s; and $S_{Y_{ig}}$ is source phase of a corresponding component;

the component equation of solid phase part is:

$$\frac{\partial \rho_{is}}{\partial t} = r_{is}$$

wherein $\rho_{is}$ is a density of an i-th component in a solid particle, with a unit of kg/m$^3$; $r_{is}$ is a reaction rate of an i-h component in the solid particle, with a unit of kg/(m$^3$·s).

8. The method according to claim 1, wherein mass transfer equation of the lower boundary layer of the bed to the exterior is:

$$D_g A \frac{\partial Y_g}{\partial x}\bigg|_s = A h_s (Y_{in} - Y_{g,s})$$

wherein $D_g$ is a diffusion coefficient of a gas, with a unit of m$^2$/s; $h_s$ is a mass transfer coefficient with a unit of m/s; $Y_{in}$ is a mass fraction of a component gas in the exterior; $Y_{g,s}$ is a mass fraction of a component gas in the lower boundary layer;

heat transfer equation of the lower boundary layer of the bed to the exterior is:

$$k_{eff} A \frac{\partial T}{\partial x}\bigg|_s = A h_T (T_{in} - T_{s2}) + A\varepsilon\sigma(T_{in}^4 - T_{s2}^2)$$

wherein $k_{eff}$ is an effective thermal conductivity of the bed, with a unit of W/(m·s); $H_T$ is a heat transfer coefficient with a unit of W/(m$^2$·K); $T_{in}$ is temperature of the exterior with a unit of K; $T_{s2}$ is a temperature of the lower boundary with a unit of K.

9. An apparatus for calculating combustion in a bed of a waste incinerator, wherein the apparatus is based on the method according to claim 1, comprises:

a memory for storing a computer program;
a processor for running the computer program stored in the memory to execute the method according to claim 1.

10. A non-transitory computer-readable storage medium on which computer program instructions are stored, wherein the computer program instructions, when executed by the processor, implement the method according to claim 1.

* * * * *